(12) United States Patent
Black et al.

(10) Patent No.: US 6,542,000 B1
(45) Date of Patent: Apr. 1, 2003

(54) NONVOLATILE PROGRAMMABLE LOGIC DEVICES

(75) Inventors: William C. Black, Ames, IA (US); Bodhisattva Das, Ames, IA (US); Marwan M. Hassoun, Austin, TX (US); Edward K. F. Lee, Austin, TX (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 09/627,576

(22) Filed: Jul. 28, 2000

Related U.S. Application Data

(60) Provisional application No. 60/146,932, filed on Jul. 30, 1999.

(51) Int. Cl.$^7$ ................................................ H03K 7/38
(52) U.S. Cl. .......................................... 326/39; 326/40
(58) Field of Search ................................ 365/158, 171, 365/173; 326/37, 38, 39, 40

(56) References Cited

U.S. PATENT DOCUMENTS

| | | | |
|---|---|---|---|
| 4,731,757 A | 3/1988 | Daughton et al. | 365/173 |
| 4,751,677 A | 6/1988 | Daughton et al. | 365/158 |
| 4,754,431 A | 6/1988 | Jenson | 365/158 |
| 4,780,848 A | 10/1988 | Daughton et al. | 365/173 |
| 4,829,476 A | 5/1989 | Dupuis et al. | 365/158 |
| 4,857,418 A | 8/1989 | Schuetz | 365/158 |
| 4,897,288 A | 1/1990 | Jenson | 365/158 |
| 4,918,655 A | 4/1990 | Daughton | 365/173 |
| 4,945,397 A | 7/1990 | Schuetz | 365/158 |
| 4,953,002 A | 8/1990 | Nelson et al. | 365/53 |
| 5,012,444 A | 4/1991 | Hurst, Jr. et al. | 365/173 |
| 5,019,461 A | 5/1991 | Schuetz | 428/688 |
| 5,060,193 A | 10/1991 | Daughton et al. | 365/173 |
| 5,064,499 A | 11/1991 | Fryer | 156/643 |

(List continued on next page.)

OTHER PUBLICATIONS

Prinz, Gary A., "Magnetoelectronics", Science, vol. 282, Nov. 27, 1998 issue, "Science's Compass" review section (4 pages).

"Spin Dependent Tunnel Junctions; Clemens Group Spin Dependent Tunneling Project", 1 page abstract referring to Bobo, J. et al. "Spin Dependent Tunneling . . . " J. Appl. Phys. 83, 6685, downloaded from http://www–mse.stanford.edu/faculty/clemens/tunnelproj.http ; 07/07/99.

Bobo, J., Mancoff, F.B., Bessho, K., Sharma, M., Sin, K., Guarisco, D. Wang, S.X., Clemens, B.M.; "Spin Dependent Tunneling Junctions with Hard Magnetic Layer Pinning", J. Appl. Phys. 83, 6685–6687 (1998), American Institute of Physics.

Textbook entitled "MOS Digital Circuits", § 13.7 entitled "Latches and Flip Flops", pp. 944–947 (published prior to filing date of present application).

Textbook chapter 8 entitled "Regenerative Circuits", pp. 452–455 (published prior to filing date of present application).

(List continued on next page.)

*Primary Examiner*—Trong Phan
(74) *Attorney, Agent, or Firm*—McKee, Voorhees & Sease, P.L.C.

(57) ABSTRACT

In this invention, three schemes of nonvolatile FPLD structures are proposed using a latch that has been disclosed herein. In the first proposed scheme the latches, which can be designed using either GMR or SDT devices, will work as interconnects in a conventional Programmable Logic Array (PLA). In the second proposed scheme, the latches will constitute the look-up table for a standard PLA. In the third proposed scheme, the latch itself will work as a nonvolatile Programmable Logic Device (PLD) structure. This FPLD latch will have $2n$ GMR or SDT resistors, instead of just 2, for an n-input logic gate. By programming the resistors differently, in each scheme, numerous different logic functions from the same logic gate can be achieved.

48 Claims, 3 Drawing Sheets

U.S. PATENT DOCUMENTS

| | | | | |
|---|---|---|---|---|
| 5,349,302 | A | | 9/1994 | Cooper .................... 365/207 |
| 5,496,759 | A | | 3/1996 | Yue et al. ................. 437/52 |
| 5,569,617 | A | | 10/1996 | Yeh et al. ................. 437/48 |
| 5,748,519 | A | * | 5/1998 | Tehrani et al. ............ 365/171 |
| 5,756,366 | A | | 5/1998 | Berg et al. ................ 437/48 |
| 5,838,608 | A | | 11/1998 | Zhu et al. ................ 365/158 |
| 5,939,772 | A | | 8/1999 | Hurst et al. .............. 257/659 |
| 5,956,267 | A | | 9/1999 | Hurst et al. .............. 365/158 |
| 5,982,658 | A | | 11/1999 | Berg et al. ............... 365/158 |
| 6,178,131 | B1 | * | 1/2000 | Ishikawa et al. .......... 365/158 |
| 6,021,065 | A | | 2/2000 | Daughton et al. ......... 365/158 |
| 6,027,948 | A | | 2/2000 | Jensen et al. ............. 438/3 |
| 6,048,739 | A | | 4/2000 | Hurst et al. .............. 438/3 |
| 6,128,214 | A | | 10/2000 | Kuekes et al. ............ 365/158 |
| 6,147,900 | A | | 11/2000 | Pohm ..................... 365/158 |
| 6,147,922 | A | * | 11/2000 | Hurst, Jr. et al. .......... 365/158 |
| 6,317,359 | B1 | * | 11/2000 | Black et al. .............. 365/158 |
| 6,169,687 | B1 | * | 1/2001 | Johnson .................. 365/158 |
| 6,175,525 | B1 | | 1/2001 | Fulkerson et al. ......... 365/158 |
| 6,178,111 | B1 | * | 1/2001 | Sather et al. ............. 365/158 |
| 6,178,525 | B1 | * | 1/2001 | Fulkerson et al. ......... 365/171 |
| 6,269,027 | B1 | * | 7/2001 | Hurst, Jr. et al. .......... 365/158 |
| 6,342,032 | B1 | * | 1/2002 | Black et al. .............. 365/158 |

OTHER PUBLICATIONS

S. Tehrani, E. Chen, M. Durlam, T. Zhu, & H. Goronkin; High Density Novolatile Magnetoresistive RAM: 0–7803–3393 © 1996 IEEE; IEDMp9–193–96; 7.7.1–7.7.4; Motorola, Inc. Phoenix Corporate Research Laboratories, 2100 E. Elliot Rd., Tempe, AZ 84284.

Marwan, M. Hassoun, William C. Black, Jr., Edward K. F. Lee, & Randall L. Geiger, Iowa State University, EcpE Department, 2001 Coover Hall, Ames, IA 50011: Allan Hurst, Jr. Honeywell, Inc. Solid State Electronics Center, 12001 Highway 55, Plymouth, MN 55441; Field Programmable Logic Gates Using GMR Devices; IEEE Transactions on Magnetics, vol. 33, No. 5, Sep. 1997; pp. 3307–3309.

Tehrani et al. "High Density nonvolatile Magnetoresistive RAM", Motorola In., phoenix Research Laboratories, pp. 7.7.1–7.7.4. IEEE 1996.

* cited by examiner

NONVOLATILE PROGRAMMABLE LOGIC DEVICES

This application claims the benefit of provisional application Ser. No. 60/146,932, filed Jul. 30, 1999.

BACKGROUND OF THE INVENTION

1. Field of the Invention

The present invention relates to nonvolatile programmable logic using integrated magnetic devices such as giant-magneto-resistance (GMR) or spin-dependent-tunneling (SDT) devices. Such programmable logic is useful for programmable logic circuits, adaptive computing systems, programmable analog circuits, magnetic random access memories, and control systems.

2. Problems in the Art

Programmable Logic Devices (PLDS) and Programmable Logic Arrays (PLAs) are widely used for inexpensive prototyping and small volume production runs of digital logic functions. Typically, the term 'PLD' is used to describe a relatively small device that can be used to realize perhaps a sum of products or customized state machine and where the program information is usually stored in some form of nonvolatile memory. The term, programmable logic array or PLA on the other hand, usually denotes a more complicated structure that may contain many thousands of equivalent gates but where the programming information is usually stored in a volatile program memory that must be loaded during power up. More recently, some versions of these programmable logic devices that have the capability of being rapidly reconfigured have also been shown useful in high performance and specialized computing.

A significant problem with PLAs, which are largely based upon RAM (random access memory)-like cells, is that the memory is lost upon loss of power. This is contrary to ROM (read only memory) where data is typically stored during manufacturing and is nonvolatile. A computer normally employs random access memory for fast storage of in-use programs or data, although in the case of PLAs it is used for storing the customized programming information.

Nonvolatile memory, besides magnetic disks and tapes, is not new in the art. Computer core memory itself was nonvolatile before the introduction of semi-conductor RAM in the early 1970's. It was assembled from magnetic cores, which were fabricated out of magnetic ferrite materials. These transformer coils were tiny toroidal rings, which were threaded with fine copper wires. Current pulses through the wires would magnetize the cores at either right or left handed to store a 0 or a 1; and thus have a bipolar or binary memory element. Each core was a bit. However, this memory was slow and expensive and was low density by today's standards.

In comparison, present semi-conductor RAM is relatively fast, relatively cheap to fabricate in large quantities, and relatively small. However, it is volatile. Similarly, most semi-conductor digital components, such as latches, counters, flip-flops, etc. have the above-mentioned advantages, yet are also volatile. There is a need for non-volatile components of this type. Further, regardless of non-volatility, there is room in the art with respect to RAM or other digital logic components that are further reduced in size, speedier, more reliable, and can be operated by and consume less power.

Attempts have been made to use magnetic principles (nonvolatile) as a method of storing binary information. An example is experimentation with anisotropic magnetoresistance (AMR) using one or more layers of AMR magnetic film. Localized portions of the material are magnetized in different directions to store the binary information.

The Giant Magnetoresistance Effect (GMR) results in larger changes in resistance in response to small magnetic fields in certain layered materials than are typically observed with the AMR effect. The GMR effect and a general explanation thereof are discussed in Prinz, Gary A., "Magnetoelectronics," Science 282, 1660 (1998), incorporated by reference herein. Depending on the magnetism relative to spin polarization of current, the GMR material can be more or less conductive for electrons of specific spin polarization.

It has been shown that the magnetic field generated by even small currents could thus "program" a GMR component to several "logic states," i.e. higher resistance or lower resistance. Thus, it would be possible to "sense" the logic state by sending current through the programmed GMR component and deriving its resistance (i.e. whether it is the higher or lower resistance). This produces a bipolar memory element that has the advantages of low power read or write, non-volatility, and self-contained. Also, importantly, there are no limitations to the number of read/write cycles known and both reading and writing can be done at high speeds; higher than most existing nonvolatile latches or memory elements.

Spin-polarized tunneling or spin dependant tunneling (SDT) is discussed at Bobo et al., "Spin dependent tunneling junctions with hard magnetic layer pinning", J.Appl.Phys. 83, 6685 (1998), incorporated by reference herein, as another example of a possible magnetic device. In memory applications, SDT devices may be preferable to GMR devices in that they typically have a larger signal and higher intrinsic resistance for small area components.

However, the mere fact that GMR effect or SDT have been pointed out as a possible memory element is not sufficient for their effective implementation and use in an actual programmable logic circuit, where not only must data be stored in the device but also efficiently retrieved with a minimum of sensing circuitry. To perform adequately, the memory element must not only be programmable or writeable to at least two states; the different states must be reliably readable by the system. Further, it is important that the memory element be able to reliably withstand multiple, and preferably unlimited, read and/or write cycles. There is presently no known nonvolatile memory scheme that satisfactorily meets these criteria in such programmable logic circuits.

There have been some attempts to create nonvolatile, solid state latches or memory elements that improve over the state of the art. Some of the problems with these attempts are as follows. Many of such components require significant write energy. They have limitations regarding read/write speed and number of read/write cycles.

One specific example is called NVRAM or non-volatile random access memory (e.g. from Xicor). It is relatively large in that it actually consists of both a volatile conventional RAM memory and a similarly sized nonvolatile memory that is written with the contents of the volatile RAM during a power failure. In order to have energy to perform this writing of the non-volatile memory, it usually requires an external capacitor. In order to restore the state of NVRAM to what existed prior to power-down, the non-volatile memory is read upon the restoration of power and transferred to the conventional RAM. Because of the dual-memory configuration and the external component, this architecture is not conducive to large scale RAM and the like. Similarly, most PLD devices employ some form of nonvolatile programming technology that may not be changed after it is initially programmed or that may require many microseconds or milliseconds of time to reprogram. Most of these latter types of devices can also only be programmed a limited number of times because repeated programming eventually harms the device.

Programmable logic circuits have evolved since the 1970's. These circuits have revolutionized digital prototyping and design by offering cost effective and rapid hardware solutions to complex digital design problems that now routinely exceed 100K equivalent gates per chip. Historically, these circuits have employed digital memory cells that defined user programmable logic blocks (usually via look-up tables (LUTs)) and customized interconnects between the logic blocks. In traditional implementations of these circuits, the program memory would be changed only in the process of debugging the design and would thereafter be fixed in each chip. In the most advanced forms of field programmable logic circuits (FPGAs), static complementary metal-oxide-semiconductor (CMOS) registers or static random-access memory (SRAM) are used to define the various LUTs and associated interconnects. Because this memory is volatile, any loss of power will require that they be reinitialized into the desired state, usually via an external nonvolatile memory. On-chip nonvolatile alternatives to CMOS memory, such as antifuse or EEPROM, inevitably have other drawbacks. Antifuse methods, whereby a short is intentionally made between on-chip interconnect lines, is inherently a one-time process that is generally not accomplished in its original place. While EEPROM methods are generally reversible, at least up to some number of cycles, writing is typically very slow (often on the order of milliseconds) and specialized on-chip circuitry may be required to write the memory cells.

An interesting variation on the use of FPGAs is in reconfigurable computing. In this application the FPGA program information is changed on the fly to achieve, in some cases, significantly improved computational results. The primary limitation to fruitfully employing these reconfigurable structures is the time required in reprogramming the circuit from one state to another. For example, in FPGA architectures not specifically designed for rapid reprogramming, such as a commonly employed shift register based programming scheme, changing even a single bit will require reprogramming the entire array. This I/O bottleneck continues to be a problem even on more sophisticated arrays forcing the designer to employ bank switching or some similar method that does not actually reuse the programmable logic so much as merely select one portion at a time.

It is therefore a primary object of the present invention to improve over the problems and deficiencies in the art, relevant to nonvolatile programmable logic.

Another object of the present invention is to provide state storage or logic information that is nonvolatile.

Further objects, features and advantages of the present invention include an apparatus and method for a nonvolatile programmable logic, which has:

a) low write energy;
b) an unlimited number of read/write cycles;
c) the entire function can be included on-chip, and therefore no off-chip components are needed;
d) the capability of rapidly reconfiguring significant portions or even the entire programmable logic device in a very short period of time;
e) circuitry that is easier to manufacture;
f) low power dissipation;
g) fast response time; and
h) significant flexibility.

These and other objects, features, and advantages of the invention will become more apparent with further reference to the specification and claims.

SUMMARY OF THE INVENTION

The invention is programmable logic using what are referred herein to generally as integrated magnetic devices, e.g., giant-magnetoresistance (GMR) or spin-dependent-tunneling (SDT) devices. Magnetic-based data storage can be programmed using an on-chip current generated magnetic field. In latch form, the circuit relies on the integrated magnetic devices, as the fundamental data storage unit.

The invention includes a variety of aspects of programmable logic. In first and second aspects, using magnetic devices configured in the form of a latch cell, the state of magnetic devices may be used to open or close switches or define the contents of look-up tables used within programmable logic. In the third aspect the magnetic components are programmed in pairs (consisting of an evaluation and reference device) and placed in series under or over the input current lines. Together, the relative resistance of the evaluation string and the reference string define the logical output of the circuit with the logical function determined by the programming of the magnetic devices.

Resistance of the integrated magnetic device can be programmed to higher or lower values with an on-chip current generated field. This higher or lower resistance can then be sensed and translating to high or low states (binary states) in the circuit. It can be used as long or short-term data storage without electrical power support. It does not have an inherent limitation on the number of read/write cycles.

DETAILED DESCRIPTION OF THE PREFERRED EMBODIMENT

To assist in a better understanding of the invention, preferred embodiments of the invention will now be described in detail. It is to be understood that these are but exemplary forms the invention can take and are for purposes of illustration and not limitation.

Overview

Figure 1:
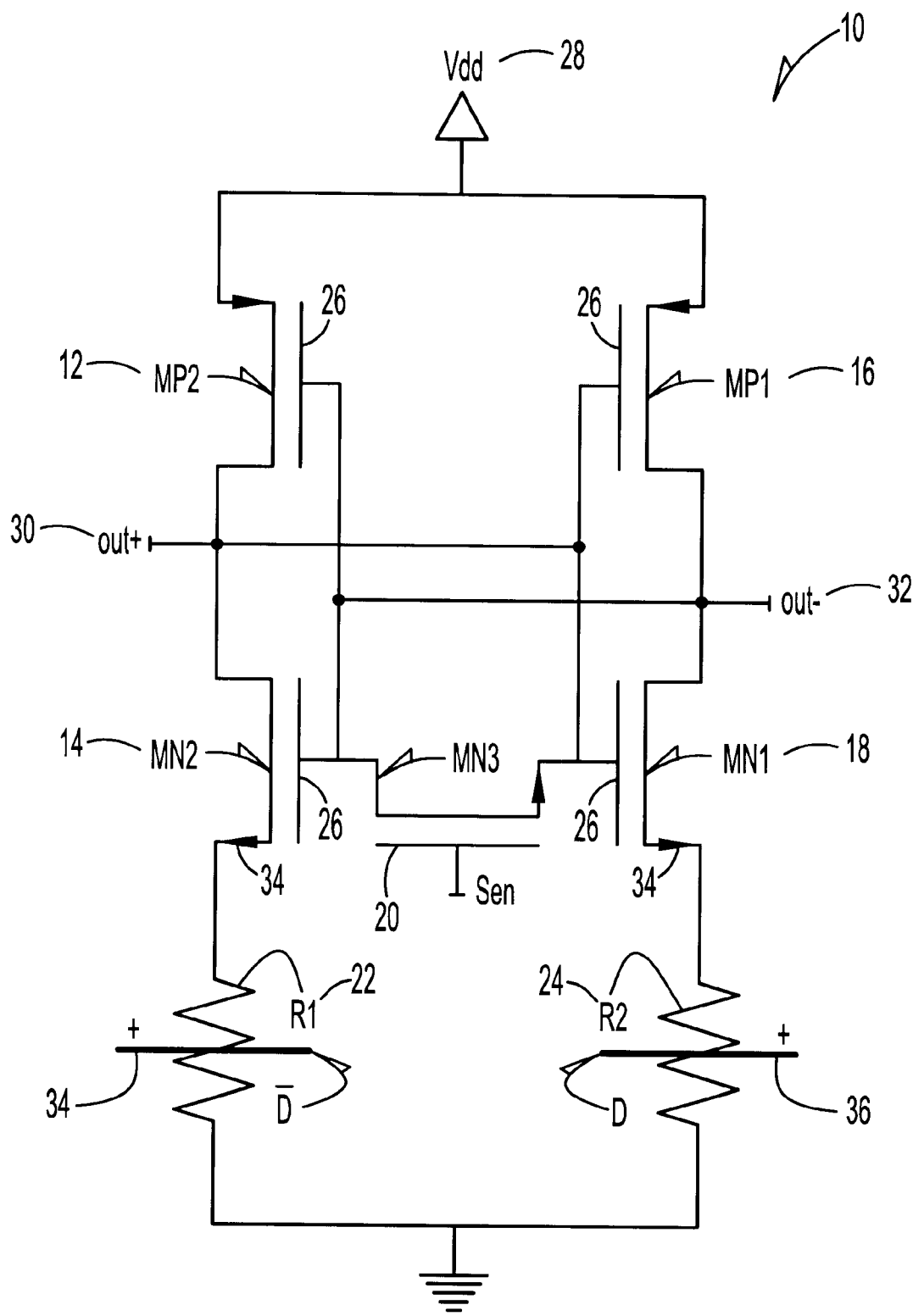
FIG. 1 is a schematic diagram of the latch that can be used in a variety of programmable logic according to the present invention.

Giant-magnetoresistance (GMR) and spin-dependent-tunneling (SDT) devices offer some significant advantages over traditional memory methods. By applying a data dependent current across or under these magnetic elements as shown in FIG. 1, data may be stored as magnetic domain orientations within the layers of the GMR or SDT films. These data dependent orientations may be "read" by applying a known magnetic bias field and measuring the resistance of these magnetic devices relative to a previously known state. (Note that for GMR films the resistance is measured horizontally or vertically, whereas for the SDT junctions it is measured vertically.) If the magnetic domains within the "bits" are time stable, storage of this information will not depend upon a reliable power supply or the length of time since it has been written; and hence will be nonvolatile, meaning that it will survive a power failure unscathed. This is a very desirable characteristic for both large random access memories and even small sequential machines that is presently all but impossible to achieve without complicated back-up power supplies or the use of relatively slow flash or EEPROM memory. GMR and SDT devices come in two basic flavors: (1) a pinned device whereby one of the magnetic layers is inhibited from rotating by an adjacent anti-ferromagnetic layer (commonly known as a spin valve for GMR devices); and (2) an unpinned device where both layers are free to rotate (often referred to as a pseudo-spin valve for GMR devices). In the latter case, one of the layers is usually harder than the other resulting in what is really a four-state device for bits with stable parallel and anti-parallel alignment of layer magnetic moments.

The effective resistance of SDT junctions is orders of magnitude higher than GMR resistors for device sizes likely to be employed in memories or logic circuits. With proper interface electronics, however, either of these devices may be used as memory or logic elements where the preferred strategy is to read the bit in such a fashion as to nondestructively evaluate the contents of the bit. For the pinned device this is usually accomplished by reading the bit at near zero word current as the soft layer will still be in the same orientation into which it was last written and this will be either parallel or anti-parallel with the pinned layer. (The orientation of the pinned layer is typically set during manufacturing.) Hence, this layer must either be written first, or actually be the programming layer, whereas reading is accomplished at a field sufficient to set the soft layer into a known orientation. For both pinned and unpinned devices the relative orientations of the layers can be easily determined by simply measuring the resistance of the device, which will be high if the hard and soft layers are anti-parallel, and low if they are parallel. Note that although four states are really present for the unpinned devices in most cases only two states are typically employed because of stability issues with the bits, and because two of the states are typically used to read the bit in a nondestructive fashion. Nevertheless, these four state schemes are interesting because of the possibility of doubling the effective bit density.

Programmable logic can be accomplished with giant-magnetoresistance (GMR) or spin-dependent tunneling (SDT) devices with relatively simple circuitry. Logic functions can be implemented as either conventional programmed logic arrays (PLAs) implementing GMR or SDT devices as nonvolatile programming elements or as arrays of universal logic gates where the logic functions are magnetically programmed. Both methodologies can also be implemented with rapidly reconfigurable variations that have applications in high performance and adaptive computing.

The word programmable means that the logic hardware can be electronically configured to suit a particular application. By enabling users to effectively create their own custom hardware configurations, many different logic designs may be prototyped on the same integrated circuit design. In some technologies this hardware may be reconfigurable, meaning different logic designs may be realized on the same integrated circuit (one at a time) as compared to one time programming that requires a new chip for each change of hardware configuration. The ability to reconfigure logic is useful for more than simple device prototyping. In a computer or signal processor, for example, the hardware could conceivably be reconfigured to efficiently handle the problem presently being executed. As new tasks are then sent to the processor, it could be reconfigured again to most efficiently handle the new tasks.

On-chip magnetic devices may be used to define programmable logic functions or even used to perform logic functions themselves. In one such arrangement, the state of magnetic devices may be used to open or close switches or define the contents of look-up tables used within programmable logic devices. Hence, by programming the magnetic elements, various digital configurations and operations are possible. In another configuration, switching thresholds of magnetic devices are used as a means of defining logic operations to be performed upon input data that is represented as current amplitude or direction in wires going across or under the magnetic element. In yet a third scheme, magnetic components are programmed in pairs (consisting of an evaluation and reference device) and placed in series under or over the input current lines. Together, the relative resistance of the evaluation string and the reference string define the logical output of the circuit with the logical function determined by the programming of the magnetic devices.

Integrated magnetic devices can be used to relieve various drawbacks in the state of the art by allowing a number of logic configurations to be stored magnetically and electronically selected upon demand. Furthermore, even state machine data could be stored in nonvolatile latches. This would allow extraordinary functional and performance improvements over any present method.

Structure of the Preferred Latch Embodiment

By referring to FIG. 1 an exemplary latch cell circuit for a nonvolatile magnetic latch 10 according to a preferred embodiment of the invention is illustrated. The specific specification of the preferred latch embodiment can be found at co-pending U.S. applications filed under Ser. Nos. 09/610,503 and 09/605,113 herein incorporated by reference. It is to be understood that each element labeled with an M is represented as a CMOS type transistor (12, 14, 16, 18, 20). It should be noted that the invention is not limited to CMOS type transistors (12, 14, 16, 18, 20). Each element listed with an R is an integrated magnetic device 22 and 24, such as a GMR or SDT component and could be a GMR device with a Current Perpendicular to the Plane (CPP) architecture.

Transistors MP1 16, MP2 12, MN1 18, and MN2 14, and their interconnection, represent a traditional cross-coupled inverter pair CMOS latch cell, which is employed as a part of data sensing.

MN3 20 is located between gates 26 of the above-described two cross-coupled inverters and essentially represents a switch used to reset and initiate the regenerative sequence. This is the data sensing sequence.

R1 22 and R2 24 are the integrated magnetic devices, for example SDT components, and play the role of the fundamental nonvolatile storage unit of the circuit. The structure of such SDT components is set forth and explained at Bobo et al. The particular SDT structure used in this implementation of latch 10 is set forth although alternate structures can be used.

Circuit 10 is powered by Vdd (5VDC) 28 and has two outputs, "out+" 30 and "out−" 32. It has been found that it may be necessary to protect SDT devices from voltages greater than approximately 0.5 volts. Voltages greater than this may put the SDT device at risk of improper functioning or damage. There are several ways how this could be done, such as are within the skill of those skilled in the art. One example includes via device sizing, where the voltage drop across the junctions is limited to less than this amount. Another example is to add other components to limit voltage, e.g., a component or components that add a current source in series with the circuit described herein.

The resistance of a GMR or SDT component can be programmed to a high/low resistance state with an on-chip current generated magnetic field. Such can be accomplished by running lines above or below and across, R1 22 and R2 24. Current through such lines will generate a magnetic field which can be used to "program" or "write to" components R1 22 and R2 24. Components R1 22 and R2 24 are connected to sources 34 of N channel MOS transistors 14 and 18 and act as the inputs to latch cell 10.

As is discussed in more detail elsewhere herein, switching transistor MN3 20 is located between gates 26 of the two cross-coupled inverters and is used to reset and initiate the sense cycle.

The output of the cross-coupled inverter pair is sent to each inverter where the input state to the inverter is inverted. Switch MN3 20 is an N channel MOS type transistor, although in other embodiments could be a PMOS transistor or a transmission gate. The output of each cross-coupled inverter is sent to the input of the other. This circuit is commonly referred to as a bi-stable circuit having two complimentary outputs. The state of outputs 30 and 32 depends on an external excitation that forces out+ 30 and out− 32 to a particular state or upon magnetic information sensed by turning on and off MN3 20. Latch 10 then memorizes this external action by staying indefinitely in the acquired state. Thus, latch 10 can function as a simple memory circuit (as for example in a six-transistor SRAM cell), but with a magnetic "shadow" memory that can be read at any time.

Operation

The following is a detailed discussion of the operation of nonvolatile magnetic latch 10. For a more detailed description of the operation of this circuit, please refer to co-pending applications Ser. Nos. 09/610,503 and 09/605,113 incorporated by reference.

As shown in FIG. 1, electrical lines 34 and 36 (also labeled as "write line" D or $\overline{D}$) pass over components R1 22 and R2 24. By appropriate control of the current through write lines 34 and 36 (including magnitude and direction of current flow), the resistance in R1 22 and R2 24 can be affected. For example, R1 22 can be programmed to a higher resistance than R2 24, or vise versa.

All wiring can be done on-chip. The programming of components R1 22 and R2 24 actually equates to the storing of information inside cell 10. Once the complimentary resistance states are written into SDT components R1 22 and R2 24, cell 10 is now prepared for what is called herein the sense cycle.

MP1 16, MP2 12, MN1 18, and MN2 14, representing the traditional cross-coupled inverter pair CMOS latch cell, essentially create what will be called a regenerator circuit that is sensitive to any circuit imbalance. Without any input to force the circuit to an alternate state, latch cell 10 will stay at a particular state indefinitely. Components R1 22 and R2 24 combined with shorting switch MN3 20 can act as that input. Because components R1 22 and R2 24 have complimentary resistance states; meaning that one has a higher resistance than the other; they have made the cross-coupled inverter pair circuit imbalanced. When MN3 20 switch between gates 26 of the two cross-coupled inverters is used to reset and initiate the regenerated sequence, the inputs to latch cell 10 will be from components R1 22 and R2 24 at the source of the two N channel MOS transistors 14 and 18.

To change the state of latch cell 10, one merely needs to change the states of components R1 22 and R2 24. If the resistances of R1 22 and R2 24 were reversed, and a sense pulse applied to the circuit, latch cell 10 would change its logic state (i.e. "out+ 30 is high or 5 V, and out− 32 is low or 0 V). Thus, by controlling the magnitude and direction of current through write lines 34 and 36 associated with R1 22 and R2 24, the resistance offset in R1 22 and R2 24 can be switched to switch the logic state of latch cell 10.

Latch circuit 10 works with power or without power. With power, the circuit merely acts as the standard random access memory that is prominent in today's art. However, if power.were lost, components R1 22 and R2 24 would hold their state via the magnetism of the components. Therefore, if power is lost and then regained, latch cell 10 will have the state that it last had before the loss of power following the brief application of signal "sense." This circuit, therefore, creates random access memory, which is not subject to loss of memory due to power outages or accidental loss of power. On "power-up" of the latch cell or at periodic "refresh", "sense" is held high briefly and then released.

Simple latch circuit 10 can be used as a conventional five or six transistor RAM cell whereby out+ 30 and out− 32 are forced through additional transistors to either a high or low state. This state may be read by turning on these same access transistors. In this arrangement, the memory storage is volatile, like most static RAM. However, by inclusion of the sensing mechanism 20 ("SEN" in FIG. 1) and devices R1 22 and R2 24 in two legs of latch 10, such an SRAM cell can quickly assume the state programmed by the magnetic orientation of R1 22 and R2 24. This dual-memory function is sometimes known as a shadow memory and would allow a device for example to "boot-up" based upon the values stored in the magnetic memory while subsequently operation on the values written in the conventional CMOS fashion.

Embodiments of Programmable Logic

On-chip magnetic devices may be used to define programmable logic functions. The integrated magnetic component or components can be used as follows:

a) using the state of the magnetic devices to open or close switches thus becoming nonvolatile interconnects in a standard programmable logic array (PLA);

b) as the look-up table in a conventional PLA;

c) as a nonvolatile quickly reprogrammable logic device (PLD) itself.

All these schemes are nonvolatile in nature due to the inherent nonvolatile character of the integrated magnetic devices.

A. Nonvolatile Interconnects in a Conventional PLA

In its most basic form latch 10 operates as an interconnect either enabling or disabling switches (e.g., transistors in FIG. 2) which connect various logic lines to particular logic busses or other interconnect lines which can be on or off-chip.

In a more elaborate form latch 10 can be used to realize programmable logic functions similar to a conventional PLA, with latch 10 serving as the nonvolatile provider of the connection voltage. Two rows 42 and 44 and two columns 46 and 48 of such a programmable array is shown in FIG. 2.

Figure 2:
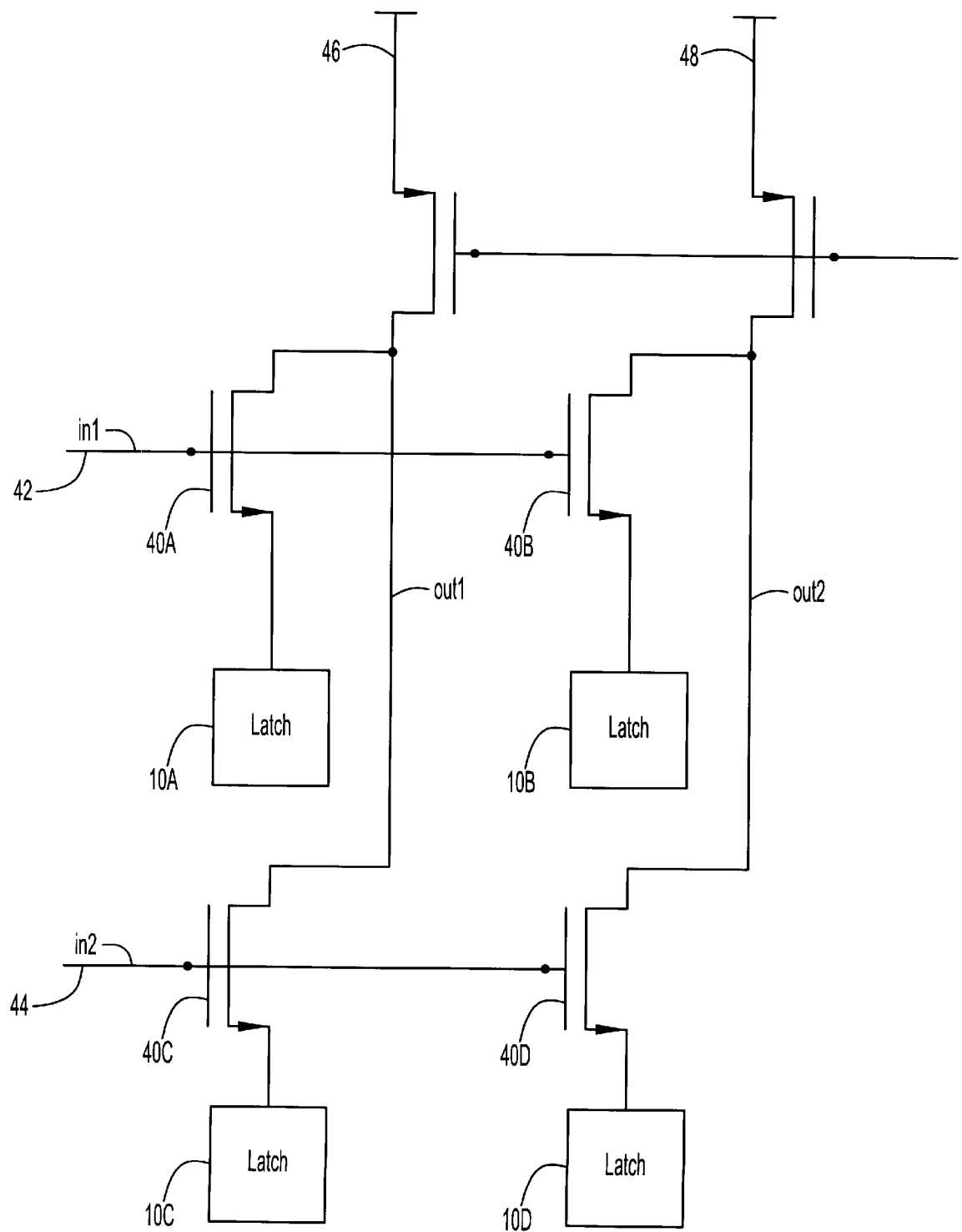
FIG. 2 is a schematic diagram of two rows and two columns of a programmable logic array used in a first embodiment of the present invention.

In the schematic of FIG. 2, if latch 10 output connected to a particular transistor switch 40 is Low and its associated input line (42/in1 or 44/in2) is high, transistor switch 40 is on. If the output (out1 or out2) of latch 10 is High, regardless of the state of input line 42 or 44, switch 40 is off. Any output of latch 10 described in the previous section can serve as latch 10 output. This scheme will have low power dissipation owing to the fact that the latches have no static current, and hence, no static power during the normal operation. Latches 10A–10D dissipate static power only when they are reset.

The discussion above points out how latch 10 can be used to effectively disable or disconnect various transistors 40 (four transistors 40*a–d* in FIG. 2) from their associated outputs as well as being implemented as a programmable logic function. Therefore, latch 10 realizes a programmable logic device although it can also be considered a programmable interconnect. Various input lines can be effectively applied selectively to various outputs (with an inversion) by only enabling one transistor on a given output. Therefore, the user has selective control over the programmable logic's output. Note also that individual input lines 42 and 44 in FIG. 2 could be the outputs of other programmable or fixed logic gates. In this case, magnetic latch 10 can also be used to directly switch logic or signal lines to various busses or interconnect lines on large circuits thus becoming a virtual programmable switchboard.

B. Look-up Table in a Conventional PLA

Figure 3:
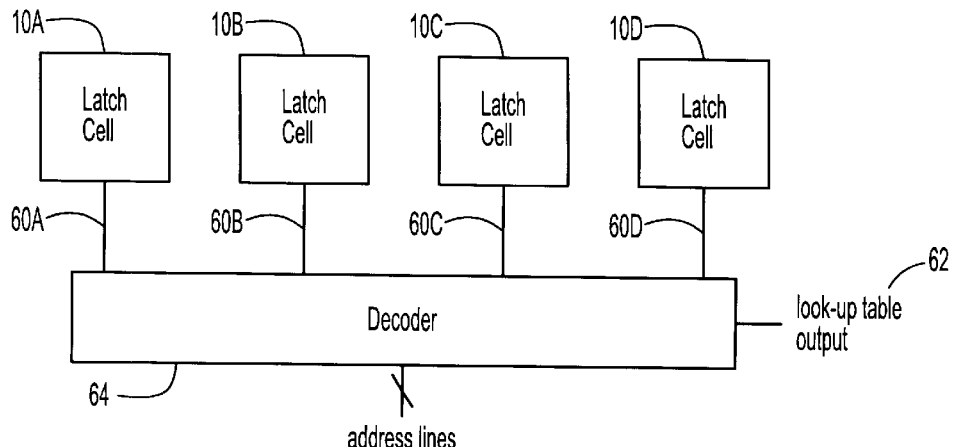
FIG. 3 is a block diagram of an example look-up table for a programmable logic array in a second embodiment.

The block diagram of an example of this structure is shown in FIG. 3.

In this scheme, latch 10A–10D cells (comprising SDT or GMR devices) will constitute the look-up table of a standard PLA. The address lines 60A–60D to the decoder will serve as logic input lines and look-up table output 62 will be the logic output. Depending on the input logic combination, decoder 64 will choose one of latch cell 10A–10D outputs to be the final output. The look-up table (i.e. the latches) will be programmed according to the gate to be obtained. There is no need to restore this look-up table information on power-up because latches 10A–10D are nonvolatile in nature.

C. Nonvolatile Field Programmable Logic Device (FPLD)

Figure 4:
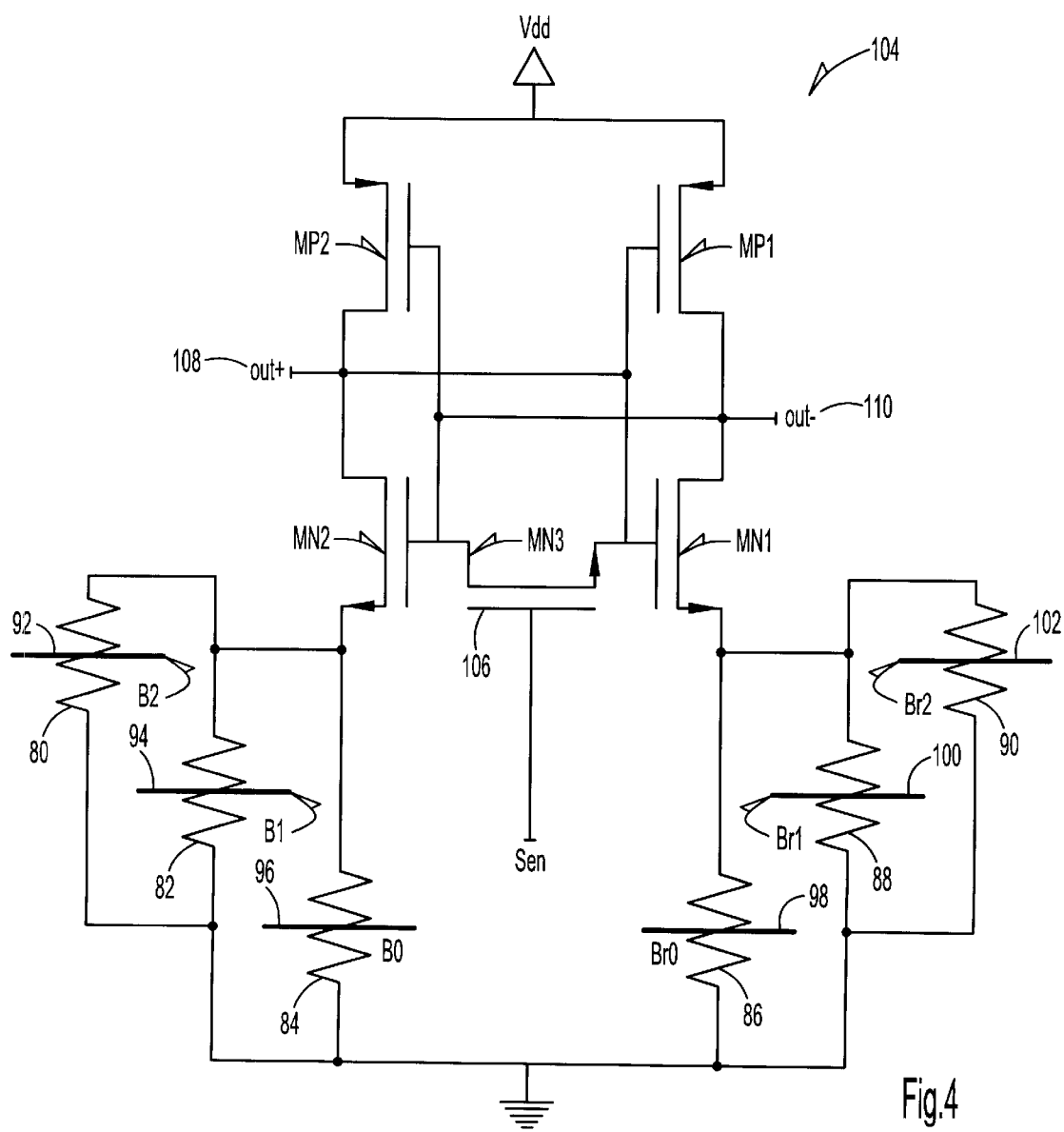
FIG. 4 is a circuit schematic of a reconfigurable static latch cell as described in the third embodiment.

This aspect has the advantage of being relatively compatible with existing circuit design flows and is particularly promising in rapidly reconfigurable circuits. While in principle a conventional MRAM memory could be used to store the programming information and download it to conventional CMOS circuitry when needed, a more interesting scheme is shown in FIG. 4. This is a simple regenerative CMOS latch cell that has been placed atop either series or parallel connected SDT or GMR resistors 80–90. Word lines 92/B2, 94/B1, 96/B0, 98/Br0, 100/Br1, and 102/Br2 crossing the bits may either be valid input data (in which case the circuit will function as a limited look-up table) or may be used to uniquely address one pair of magnetic bits 80–90 (in which case it functions as an addressable latch). By programming the resistors 80–90 on the left and the right in a complementary fashion, latch cell 104 can sense the magnetic information by briefly turning on shorting switch 106 and then promptly turning it off. Note that for one pair of bits to be uniquely addressed by one of word lines 92–102, unselected bits must revert to a known resistance state. Alternately, each pair of associated bits could be connected to ground through an additional n-type metal-oxide-semiconductor (NMOS) type switch (not shown in FIG. 4). If latch 104 is used to define programming information in an FPGA type circuit, the entire array could consist of memories of this type that could change in a single clock cycle from one set of program states to another. Indeed, the designer could choose to program shorting switch gates 106 to make any portion of the FPGA reprogramable in one clock tick. This is equivalent to the bank switching approach mentioned earlier but in this case the CMOS circuitry is actually the same for all switched banks. Another interesting use of latch 104 is to configure it as a SRAM memory cell with an additional pair of access transistors to each inverter output node 108 and 110. This circuit may be read and written like a conventional CMOS SRAM memory but where it also possesses an addressable magnetic shadow memory, potentially with embedded logic functions, that may be invoked at any time by simply energizing the reset switch 106.

Each resistor leg of latch 104 of FIG. 4 has more than one and, an equal number of, resistors 80–90 (GMR or SDT) in parallel in each leg. An n-input logic gate will have n resistors (n=any integer 1, 2, 3, . . . ) in parallel in each leg, totaling 2n resistors. All resistors 80–90 should be designed substantially the same; i.e. they should have almost equal high resistance values and almost equal low resistance values and should have similar thermal behavior. One of the legs will be called the evaluation leg and the other the reference leg. In FIG. 4, a 3-input gate is shown as an example. If the resultant resistance of the evaluation leg is higher than that of the reference leg, out+ 108 will go High. If the evaluation leg resistance is lower than that of the reference leg, out– 110 will go High. Either out+ 108 or out– 110 can be considered as the net output of the programmable logic cell, of which there may be many within an FPLD (field programmable logic device). It is assumed that there is a small offset between the two legs, which will be interpreted as a small resistance in series with the parallel combination of resistors in one of the two legs. This extra resistance is called the offset resistance. This offset resistance can, if necessary, be nullified by appropriately placing a small resistance in series in the other leg.

Both the programming and the logic are obtained by driving appropriate word currents. A logic as well as a programming scheme can be intelligently but arbitrarily defined; i.e. a programmed High can be arbitrarily defined by a particular word current value, and a programmed Low can be defined by some other word current value; and similarly for logic 0 and 1. Depending on how resistors 80–90 are programmed, numerous logic functions can be achieved from this structure. A particular logic input can be eliminated by just shorting word lines 92–102 of the corresponding pair of resistors in the evaluation and reference legs. This programmable gate can be reconfigured in nanoseconds, which make a runtime reconfiguration plausible. For 2n number resistors, this gate can possibly be configured to $2^n$ different functions. This FPLD structure is nonvolatile due to the nonvolatile nature of the GMR or the SDT resistors used.

Options and Alternatives

As previously mentioned, the invention can take many forms and embodiments. The included preferred embodiment is given by way of example only, and not by way of imitation to the invention. Variations obvious to one skilled in the art will be included within the invention.

Some examples of options, variations and alternatives are given below by way of illustration and not limitation.

The concept of using SDT can be implemented in a variety of components. Some examples are EEPROM, RAM, portable memory card, shadow memory and flash memory.

The concept of using another type of stacked GMR device that uses multiple layers with vertical conduction known as a CPP device can be implemented in a variety of components. Some examples are EEPROM, RAM, portable memory card, shadow memory and flash memory.

Fabrication of the latch cell or other embodiments according to the invention can be made according to known semi-conductor fabrication and chip procedures.

What is claimed:

1. An apparatus for use in programmable logic comprising:
   a programmable logic circuit;
   a latch incorporated into the programmable logic circuit;
   a magnetoresistive device incorporated into the latch.
2. The apparatus of claim 1 further comprising a sensing component operatively connected to the magnetoresistive device to sense a state of the magnetoresistive device.
3. The apparatus of claim 1 wherein the programmable logic comprises a programmable logic device.
4. The apparatus of claim 1 wherein the programmable logic comprises a programmable logic array.
5. The apparatus of claim 1 wherein the programmable logic comprises a component to enable or disable one or more switches; said switches connecting logic lines to logic busses or interconnect lines.
6. The apparatus of claim 1 wherein the programmable logic comprises a look up table.
7. The apparatus of claim 1 wherein the magnetoresistive device is programmed wholly or in part to a high or low resistance state with a current generated magnetic field.
8. The apparatus of claim 7 wherein the current generated magnetic field that programs resistance state of the magnetoresistive device is performed by running current on a line which is perpendicular or at an angle to and adjacent to one magnetoresistive device in addition to running current in an opposite direction on a line which is perpendicular or at an angle to and adjacent to another magnetoresistive device.
9. The apparatus of claim 8 wherein a line of current runs perpendicular or at an angle to and above, below or to a side of a magnetoresistive device.
10. The apparatus of claim 1 wherein the latch comprises a cross-coupled inverter pair and first and second magnetoresistive devices; the magnetoresistive devices being capable of having a resistive imbalance relative to one another, one magnetoresistive device operatively connected to one inverter of the inverter pair and the other magnetoresistive device operatively connected to an other inverter of the inverter pair for providing inputs to the inverter pair; the apparatus further comprising a switch connected to said inputs to the inverter pair for resetting the latch cell and amplifying a resistive imbalance between the magnetoresistive devices to allow sensing of the state of the magnetoresistive devices.
11. The apparatus of claim 10 wherein the cross-coupled inverter pair latch cell is comprised of CMOS type transistors.
12. The apparatus of claim 1 wherein the magnetoresistive device is selected from a group consisting of GMR, AMR, and CMR material.
13. The apparatus of claim 1 wherein the magnetoresistive device is a current perpendicular to plane architecture GMR device.
14. The apparatus of claim 1 wherein the magnetoresistive device is a SDT material.
15. The apparatus of claim 1 wherein the switch can be any type of transistor from a group consisting of multiple transistor, bipolar junction transistors, N-Channel MOSFET, P-channel MOSFET and CMOS transmission gates.
16. The apparatus of claim 1 further comprising a plurality of magnetoresistive storage devices.
17. The apparatus of claim 16 wherein one or more of the magnetoresistive storage devices is programmable.
18. The apparatus of claim 1 wherein the programmable logic is reconfigurable by reprogramming the magnetoresistive storage device.
19. A method for implementing a non-volatile programmable logic comprising:
   incorporating a magnetoresistive device into a latch;
   incorporating said latch into a programmable logic circuit wherein said magnetoresistive device performs as a reprogramable non-volatile memory element.
20. The method of claim 19 further comprising connecting a sensing component to the magnetoresistive device to sense a state of the magnetoresistive device.
21. The method of claim 19 further comprising utilizing the latch and the magnetoresistive device to open or close one or more switches in the programmable logic.
22. The method of claim 19 further comprising programming the programmable logic as a look-up table.
23. The method of claim 19 further comprising programming the magnetoresistive device to a high or low resistance state with a current generated magnetic field.
24. The method of claim 23 wherein the current generated magnetic field that programs resistance of the magnetoresistive device is performed by running current on a line which is perpendicular or at an angle to and adjacent to one magnetoresistive device in addition to running current in an opposite direction on a line which is perpendicular or at an angle to and adjacent to another magnetoresistive device.
25. The method of claim 24 further comprising running a line of current perpendicular or at an angle to and above, below or to a side of a magnetoresistive device.
26. The method of claim 19 wherein the latch comprising a cross-coupled inverter pair and first and second magnetoresistive devices; the magnetoresistive devices being capable of having a resistive imbalance relative to one another operatively connecting one magnetoresistive device to one inverter and the other magnetoresistive device operatively connecting to the other inverter for providing inputs to the inverter pair; and connecting a switch to the inputs to the inverter pair for resetting the latch cell and amplifying a resistive imbalance between the magnetoresistive devices to allow sensing of a state of the magnetoresistive devices.
27. The method of claim 19 further comprising incorporating additional magnetoresistive storage devices.
28. The method of claim 27 further comprising the step of programming one or more of the magnetoresistive storage devices is programmable.
29. The method of claim 19 further comprising reconfiguring the programmable logic by reprogramming the magnetoresistive storage device.
30. A reconfigurable non-volatile programmable logic circuit comprising:
   a latch cell;
   magnetoresistive devices operatively connected in said latch cell.
31. The apparatus of claim 30 further comprising a sensing component operatively connected to the magnetoresistive devices to sense a state of the magnetoresistive device.

32. The apparatus of claim 30 wherein the programmable logic circuit can be used in a programmable logic array.

33. The apparatus of claim 30 wherein the programmable logic circuit comprises a look-up table.

34. The apparatus of claim 30 wherein the magnetoresistive devices are programmed to a high or low resistance state with a current generated magnetic field.

35. The apparatus of claim 34 wherein the current generated magnetic field that programs the resistance of the magnetoresistive device is performed by running current on a line which is perpendicular or at an angle to and adjacent to one magnetoresistive device in addition to running current in an opposite direction on a line which is perpendicular or at an angle to and adjacent to another magnetoresistive device.

36. The apparatus of claim 35 wherein the line of current runs perpendicular or at an angle to and above, below or to a side of a magnetoresistive device.

37. The apparatus of claim 30 wherein the latch comprises a cross-coupled inverter pair, the magnetoresistive devices being capable of having a resistive imbalance relative to one another, a number of magnetoresistive devices operatively connected to one inverter and another equal number of magnetoresistive devices operatively connected to the other inverter for providing inputs to the inverter pair; the apparatus further comprising a switch connected to the inputs to the inverter pair for resetting the latch cell and amplifying a resistive imbalance between the magnetoresistive devices to allow sensing of a state of the magnetoresistive devices.

38. The apparatus of claim 30 wherein the cross-coupled inverter pair latch cell is comprised of CMOS type transistors.

39. The apparatus of claim 30 wherein the magnetoresistive device is selected from a group consisting of GMR, AMR, and CMR material.

40. The apparatus of claim 30 wherein the magnetoresistive device is a current perpendicular to plane architecture GMR device.

41. The apparatus of claim 30 wherein the magnetoresistive device is a SDT material.

42. The apparatus of claim 37 wherein the switch can be any type of transistor selected from the group consisting of multiple transistor, bipolar junction transistors, N-Channel MOSFET, P-channel MOSFET and CMOS transmission gates.

43. The apparatus of claim 30 further comprising a plurality of magnetoresistive devices.

44. The apparatus of claim 43 wherein one or more of the magnetoresistive devices is programmable.

45. The apparatus of claim 30 wherein the programmable logic is reconfigurable by reprogramming the magnetoresistive device.

46. The apparatus of claim 30 wherein the magnetoresistive devices are generally connected in series to said latch cell.

47. The apparatus of claim 45 wherein the programmable logic is reconfigurable in one clock cycle.

48. The apparatus of claim 30 wherein the magnetoresistive devices can be programmed to perform a plurality of programmable logic functions.

* * * * *